United States Patent
Besser et al.

(10) Patent No.: US 6,835,655 B1
(45) Date of Patent: Dec. 28, 2004

(54) METHOD OF IMPLANTING COPPER BARRIER MATERIAL TO IMPROVE ELECTRICAL PERFORMANCE

(75) Inventors: Paul R. Besser, Sunnyvale, CA (US); Matthew S. Buynoski, Palo Alto, CA (US); Sergey D. Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/994,397

(22) Filed: Nov. 26, 2001

(51) Int. Cl.$^7$ .............................................. H01L 21/44
(52) U.S. Cl. ...................... 438/653; 438/627; 438/643; 438/652; 438/658; 438/659; 438/687
(58) Field of Search ................................ 438/247, 597, 438/627, 643, 648, 652, 653, 656, 658, 659, 685, 687; 257/751

(56) References Cited

U.S. PATENT DOCUMENTS

| | | | |
|---|---|---|---|
| 5,004,520 A | 4/1991 | Tsuji et al. | |
| 5,224,520 A | 7/1993 | Shinbara et al. | |
| 5,243,222 A | 9/1993 | Harper et al. | |
| 5,300,462 A | 4/1994 | Kakumu | |
| 5,552,341 A | 9/1996 | Lee | |
| 5,654,245 A | 8/1997 | Allen | |
| 5,770,517 A | 6/1998 | Gardner et al. | |
| 5,821,168 A | * 10/1998 | Jain | 438/692 |
| 5,882,738 A | * 3/1999 | Blish, II et al. | 427/526 |
| 5,899,740 A | * 5/1999 | Kwon | 438/627 |
| 5,969,422 A | 10/1999 | Ting et al. | |
| 6,015,749 A | 1/2000 | Liu et al. | 438/628 |
| 6,030,895 A | 2/2000 | Joshi et al. | |
| 6,069,068 A | * 5/2000 | Rathore et al. | 438/628 |
| 6,090,710 A | 7/2000 | Andricacos et al. | 438/687 |
| 6,096,648 A | 8/2000 | Lopatin et al. | |
| 6,117,770 A | 9/2000 | Pramanick et al. | 438/659 |
| 6,156,638 A | 12/2000 | Agarwal et al. | |
| 6,180,522 B1 | 1/2001 | Hong | |
| 6,225,221 B1 | 5/2001 | Ho et al. | 438/678 |
| 6,242,808 B1 | 6/2001 | Shimizu et al. | 257/762 |
| 6,268,291 B1 | * 7/2001 | Andricacos et al. | 438/694 |
| 6,294,463 B1 | 9/2001 | Tseng | |
| 6,294,836 B1 | 9/2001 | Paranjpe et al. | 257/767 |

(List continued on next page.)

FOREIGN PATENT DOCUMENTS

| | | |
|---|---|---|
| EP | 0 567 867 A2 | 11/1993 |
| EP | 1 039 531 A2 | 9/2000 |
| EP | 1 039 531 A3 | 12/2000 |
| EP | 1 094 515 A2 | 4/2001 |

OTHER PUBLICATIONS

Dong Joon Kim et al, "New MEthod to Prepare W–B$^+$–N Ternary Barrier to Cu diffusion by Implanting BF$_2$,Ions Into W–N Thin Film," J, Vac. Sci. Technol. B 17(4), Jul./Aug., 1999, pp. 1598–1601.

W. F. McArthur et al., "Structural and Electrical Characterization of Si–Implanted Tin as a Diffusion Barrier for Cu Metallization," Mat. Res. Soc. Symp. Proc. vol. 391, 1995, pp. 327–332.

(List continued on next page.)

Primary Examiner—Maria Guerrero
(74) Attorney, Agent, or Firm—Foley & Lardner LLP

(57) ABSTRACT

A method of implanting copper barrier material to improve electrical performance in an integrated circuit fabrication process can include providing a copper layer over an integrated circuit substrate, providing a barrier material at a bottom and sides of a via positioned over the copper layer to form a barrier material layer separating the via from the copper layer, implanting a metal species into the barrier material layer, and providing a conductive layer over the via such that the via electrically connects the conductive layer to the copper layer. The implanted metal species can make the barrier material layer more resistant to copper diffusion from the copper layer.

20 Claims, 3 Drawing Sheets

U.S. PATENT DOCUMENTS

| | | | |
|---|---|---|---|
| 6,297,146 B1 | 10/2001 | Lopatin | |
| 6,344,413 B1 | 2/2002 | Zurcher et al. | |
| 6,365,502 B1 | 4/2002 | Paranjpe et al. | 438/622 |
| 6,399,496 B1 | 6/2002 | Edelstein et al. | |
| 6,410,383 B1 * | 6/2002 | Ma | 438/247 |
| 6,420,262 B1 | 7/2002 | Farrar | |
| 6,423,633 B1 | 7/2002 | Tseng | |
| 6,426,289 B1 * | 7/2002 | Farrar | 438/670 |
| 6,461,675 B2 | 10/2002 | Paranjpe et al. | |
| 6,465,867 B1 | 10/2002 | Bernard et al. | |
| 6,482,734 B1 | 11/2002 | Ha et al. | |
| 6,482,740 B2 | 11/2002 | Soininen et al. | |
| 6,500,749 B1 | 12/2002 | Liu et al. | |
| 6,521,532 B1 | 2/2003 | Cunningham | |
| 6,534,865 B1 | 3/2003 | Lopatin et al. | 257/751 |
| 2001/0035237 A1 | 11/2001 | Nagano et al. | 148/430 |
| 2002/0036309 A1 | 3/2002 | Sekiguchi et al. | |
| 2002/0039542 A1 | 4/2002 | Bogel et al. | |
| 2002/0053741 A1 | 5/2002 | Iwasaki et al. | |
| 2002/0084529 A1 | 7/2002 | Dubin et al. | |
| 2002/0102838 A1 | 8/2002 | Paranjpe et al. | |
| 2002/0109233 A1 | 8/2002 | Farrar | 257/762 |
| 2002/0115292 A1 | 8/2002 | Andricacos et al. | |
| 2002/0137332 A1 | 9/2002 | Paranjpe et al. | |
| 2004/0023486 A1 * | 2/2004 | Lopatin et al. | 438/639 |

OTHER PUBLICATIONS

PCT International Search Report, International Application No. PCT/US 02/32605, International Filing Date Nov. 10, 2002 ( 7 pages).

PCT International search Report, International Application No. PCT/US 02/32554, International Filling Date Nov. 10, 2002 (5 pages).

James A. Cunningham, "Improving Copper Interconnects: A Search for Useful Dopants," Semiconductor International, (Apr., 2000), pp. 1–8.

4.7.3. General Reliability Issues Associated with IC Interconnects, Silicon Processing for the VLSI Era, vol. II, pp. 264–265.

* cited by examiner-

METHOD OF IMPLANTING COPPER BARRIER MATERIAL TO IMPROVE ELECTRICAL PERFORMANCE

CROSS REFERENCE TO RELATED APPLICATIONS

This application is related to U.S. patent application Ser. No. 09/994,440, entitled METHOD OF INSERTING ALLOY ELEMENTS TO REDUCE COPPER DIFFUSION AND BULK DELUSION; U.S. patent application Ser. No. 09/994,395, entitled METHOD OF USING TERNARY COPPER ALLOY TO OBTAIN A LOW RESISTANCE AND LARGE GRAIN SIZE INTERCONNECT; U.S. patent application Ser. No. 09/994,358, entitled METHOD OF IMPLANTATION AFTER COPPER SEED DEPOSITION; and U.S. patent application Ser. No. 10/123,751, entitled USE OF ULTR-LOW ENERGY ION IMPLANTATION (ULEII) TO FORM ALLOY LAYERS IN COPPER which are all assigned to the same assignee as this application.

FIELD OF THE INVENTION

The present invention relates generally to integrated circuits and methods of manufacturing integrated circuits. More particularly, the present invention relates to implanting copper barrier material to improve electrical performance.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

One way by which integrated circuit (IC) manufacturers have attempted to reduce via resistance as the via size decreases is reducing the thickness of the barrier material. For example, IC manufacturers can try to make the barrier material very thin at the bottom of the via. The thickness of the barrier material can be reduced by chemical vapor deposition (CVD) or advanced plasma vapor deposition (PVD) processes. Nevertheless, reducing the barrier thickness causes the barrier to become more permeable to copper (Cu) diffusion, which can adversely affect resistance to electromigration (EM).

FIG. 1 illustrates a schematic cross-sectional view of a portion 100 of an integrated circuit including a copper layer 110, a via 120, and a copper layer 130. Via 120 and copper layer 130 are separated by a barrier layer 140. Copper layer 110 and via 120 can be one structure when formed in a dual in-laid process or, alternatively, two structures when formed in a single in-laid process. Barrier layer 140 inhibits diffusion of copper ions in general. Conventional barrier layers can include Tantalum Nitride (TaN).

Portion 100 also includes a dielectric layer 142 that is separated from copper layer 130 by an etch stop layer 144. Dielectric layer 142 can be oxide and etch stop layer 144 can be Silicon Nitride (SiN). Etch stop layer 144 prevents diffusion of copper from copper layer 130 into dielectric layer 142.

EM failures have been described by Stanley Wolf, Ph.D. in *Silicon Processing for the VLSI Era*, Vol. 2, pp. 264–65. Dr. Wolf explains that a positive divergence of the motion of the ions of a conductor leads to an accumulation of vacancies, forming a void in the metal. Such voids may ultimately grow to a size that results in open-circuit failure of the conductor line.

As discussed above, conventional systems have attempted to reduce the thickness of barrier layer 140 to reduce the resistance associated with via 120. However, this reduction in thickness can cause electromigration (EM) failures. FIG. 2 illustrates portion 100 described with reference to FIG. 1, further having an EM failure 145 in copper layer 130. FIG. 3 illustrates portion 100 having an EM failure 155 in via 120. EM failures 145 and 155 can be due to a reduction in thickness of barrier layer 140.

EM failures have been described by Stanley Wolf, Ph.D. in *Silicon Processing for the VLSI Era*, Vol. 2, pp. 264–65. Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for a barrier that is more resistant to copper diffusion and thin enough for low via resistance. Further, there is a need for a method of implanting copper barrier material to improve electrical performance. Even further, there is a need for a method of enhancing barrier properties by implanting a heavy metal species to improve the permeability of the barrier layer to copper.

SUMMARY OF THE INVENTION

An exemplary embodiment is related to a method of fabricating an integrated circuit. This method can include forming a barrier material layer along lateral side walls and a bottom of a via that electrically connects a first conductive layer and a second conductive layer and implanting a metal into the barrier material layer. The implanted metal makes the barrier material layer more resistant to copper diffusion.

Another exemplary embodiment is related to a method of implanting copper barrier material to improve electrical performance in an integrated circuit fabrication process. This method can include providing a copper layer over an integrated circuit substrate, providing a barrier material at a bottom and sides of a via positioned over the copper layer to form a barrier material layer separating the via from the copper layer, amorphizing the barrier material layer, and providing a conductive layer over the via such that the via electrically connects the conductive layer to the copper layer. The metal species can make the barrier material layer more resistant to copper diffusion from the copper layer Another exemplary embodiment is related to a method of forming a via in an integrated circuit. This method can include depositing a copper layer, depositing an etch stop layer over the copper layer, depositing an insulating layer over the etch stop layer, forming an aperture in the insulating layer and the etch stop layer, forming an aperture in the insulating layer, providing a barrier material at a bottom and sides of the aperture form a barrier material layer providing separation from the copper layer, implanting a metal species into the barrier material layer, filling the aperture with a via material to form a via, and providing a conductive layer over the via such that the via electrically connects the conductive layer to the copper layer. The implanted metal species can make the barrier material layer more resistant to copper diffusion from the copper layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
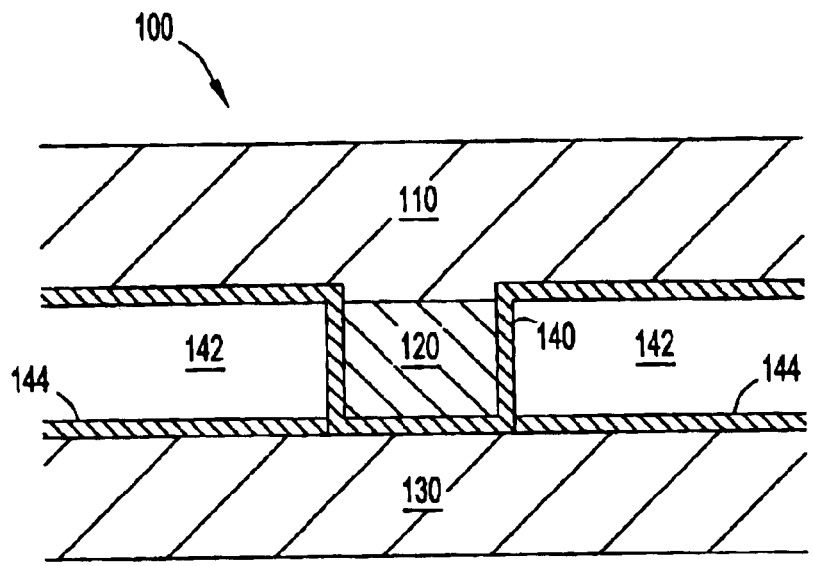
FIG. 1 is a schematic cross-sectional view representation of a portion of an integrated circuit fabricated in accordance with prior art.
Figure 2:
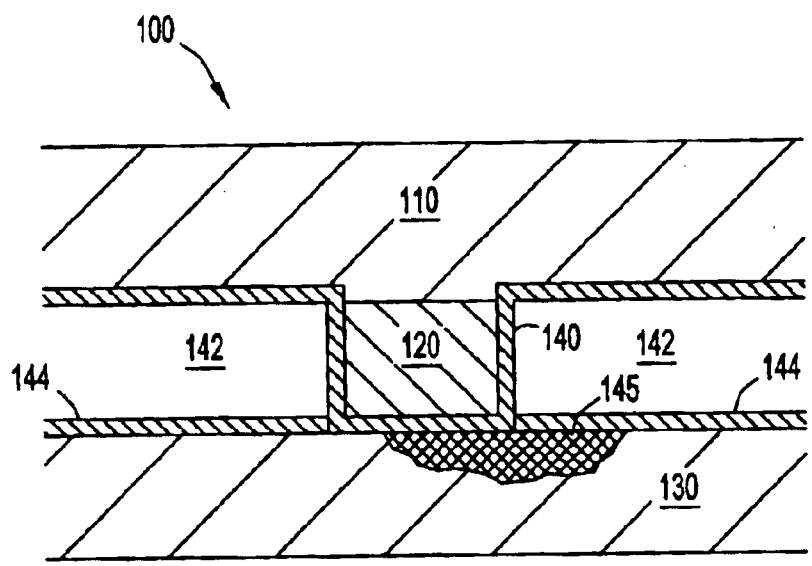
FIG. 2 is a schematic cross-sectional view representation of the portion of the integrated circuit illustrated in FIG. 1, showing an electromigration (EM) failure.
Figure 3:
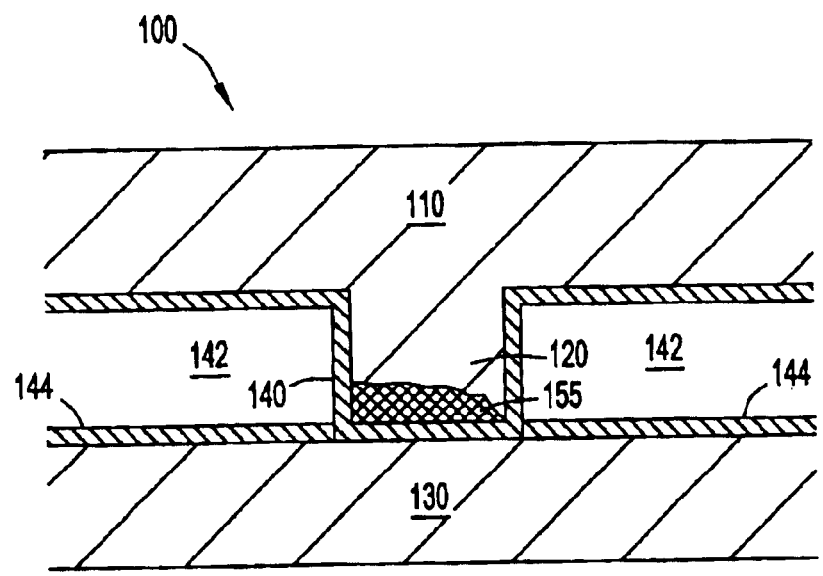
FIG. 3 is a schematic cross-sectional view representation of the portion of the integrated circuit illustrated in FIG. 1, showing an electromigration (EM) failure.
Figure 4:
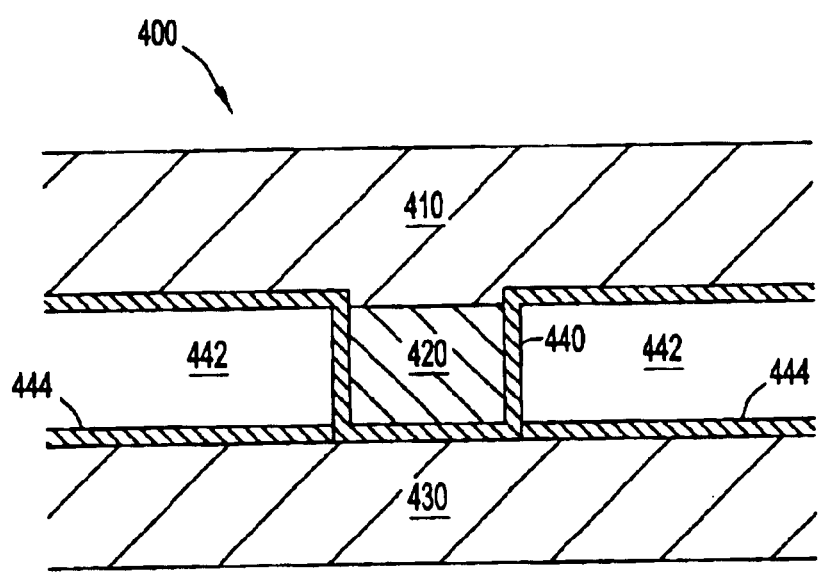
FIG. 4 is a schematic cross-sectional view representation of a portion of an integrated circuit fabricated in accordance with an exemplary embodiment.

With reference to FIG. 4, a schematic cross-sectional view representation of a portion 400 of an integrated circuit (IC) includes a conductive layer 410, a via section 420, a copper layer 430, and a barrier layer 440. Portion 400 is preferably part of an ultra-large-scale integrated (ULSI) circuit having millions or more transistors. Portion 400 is manufactured as part of the IC on a semiconductor wafer, such as, a silicon wafer.

Portion 400 can also include a dielectric layer 442 that is separated from copper layer 430 by an etch stop layer 144. In an exemplary embodiment, dielectric layer 442 is an oxide material and etch stop layer 444 is Silicon Nitride (SiN) or other suitable material. Etch stop layer 444 prevents diffusion of copper from copper layer 430 into dielectric layer 442.

Conductive layer 410 can be a layer of any conductive material, such as, copper or another metal. Via section 420 can be made of a conductive material and serves to electrically connect conductive layer 410 and copper layer 430. Copper layer 430 can be a layer of copper positioned in proximate location to via section 420. Copper layer 430 can be an alloy including copper (Cu). In an alternative embodiment, copper layer 430 is a stack of several layers.

Barrier layer 440 can be Tantalum (Ta), Titanium Nitride (TiN), Titanium Silicon Nitride (TiSiN), Tungsten Nitride (WNx), or other suitable material. In an exemplary embodiment, barrier layer 440 has a cross sectional thickness of 80 Angstroms. In other embodiments, barrier layer 440 can have dimensions as small as 10 Angstroms. The barrier properties of barrier layer 440 can be enhanced by the addition of an implant as described with reference to FIGS. 5 and 6.

In an exemplary method of fabricating portion 400, once copper layer 430 is created, etch stop layer 444 is deposited over copper layer 430 and dielectric layer 442 is deposited over etch stop layer 442. A resist layer is then deposited over dielectric layer 442 and is used in the patterning and etching of an aperture in dielectric layer 442 and etch stop layer 442 in the formation of via section 420. The resist layer is removed before depositing via material in via section 420 and depositing conductive layer 410.

Figure 5:
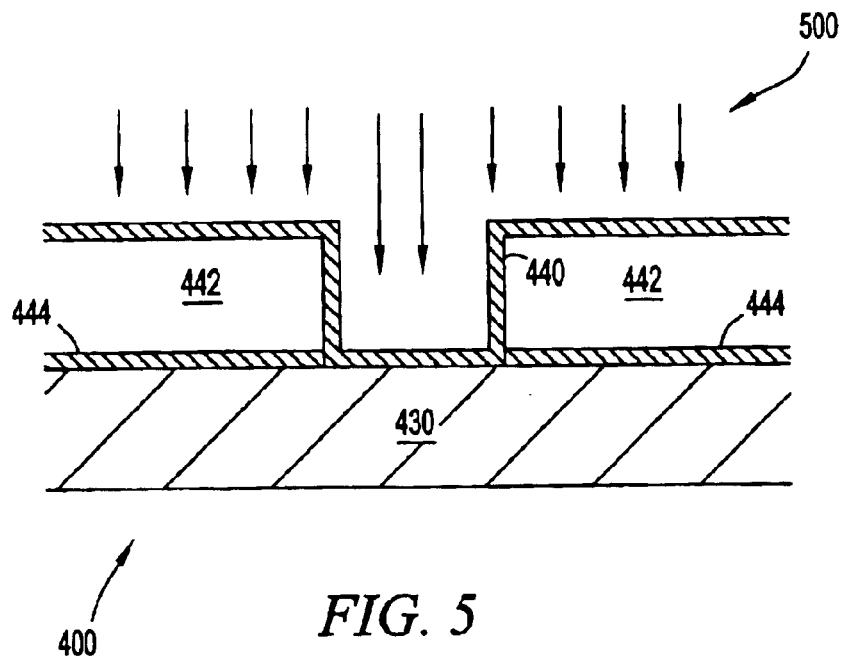
FIG. 5 is a perspective cross-sectional view representation of a portion of the integrated circuit illustrated in FIG. 4, showing a zero angle barrier layer implant.

Referring now to FIG. 5, barrier layer 440 receives an implant 500 at a zero degree angle. Implant 500 can be a metal which upon implant with barrier layer 440 can make barrier layer 440 amorphous and more resistant to copper (Cu) diffusion. In an exemplary embodiment, implant 500 is a low dose, such as, $2e^{14}$ to $2e^{15}/cm^2$, and is implanted at an energy, such as, 0.5 to 5 keV.

Implant 500 can include heavy metals, such as, Hafnium (Hf), Lanthanum (La), Barium (Ba), Tin (Sn), and Zinc (Zn). Heavy metal species are particularly useful because they amorphise the barrier at low energies. Implant 500 can also form an intermettallic with copper layer 430. An intermettallic is advantageous because diffusion will be reduced. In an exemplary embodiment, barrier layer 440 is Titanium Nitride (TiN) and implant 500 is Tin (Sn).

By providing implant 500 at a zero degree angle, a bottom 444 of via section 420 can be made more resistant to copper diffusion from copper layer 430. Advantageously, making the bottom of via section 420 more resistant to copper diffusion is good for electromigration.

Figure 6:
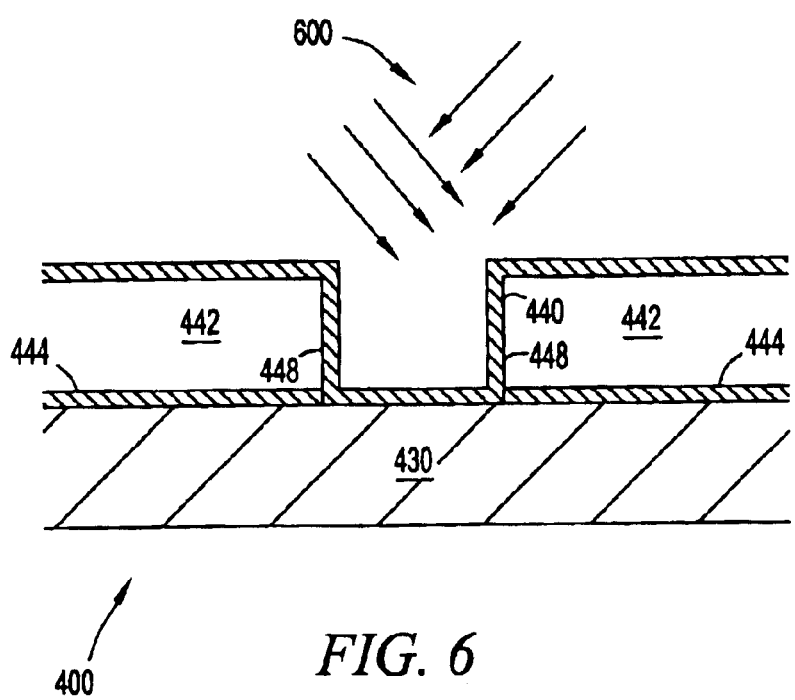
FIG. 6 is a perspective cross-sectional view representation of a portion of the integrated circuit illustrated in FIG. 4, showing a tilt angle barrier layer implant.

Referring now to FIG. 6, barrier layer 440 can also receive an implant 600 at a tilted angle. The angle of tilt can be 1 to 10 degrees with respect to bottom 444 of via section 430. Implant 600 can be a metal which upon implant with barrier layer 440 can make barrier layer 440 amorphous and more resistant to copper (Cu) diffusion. Due to the titled angle, barrier layer 440 at side walls 448 of via section 420 are made amorphous and resistant to copper diffusion. In an exemplary embodiment, implant 600 is a dose of, for example, $2e^{14}$ to $2e^{15}/cm^2$, and is implanted at an energy, such as, 0.5 to 5 keV.

One technique to achieve implantation of implant 600 at a titled angle is by rotating the integrated circuit wafer including portion 400. As such, an implanting device can be directed in one direction and, due to the rotation of the integrated circuit wafer, implant 600 can be provided along side walls 448 all around the aperture of via section 420.

Advantageously, making barrier layer 440 at side walls 448 of via section 420 more resistant to copper diffusion is good for BTS (biased thermal stressing) because the barrier is more resistant to copper diffusion. Thus, under BTS testing, copper is less likely to diffuse from one line to an adjacent upper line. Further, implantation of the metal species on side walls 448 also improves line electromigration resistance because of the reduction in copper diffusion. Another advantage is that because the barrier is thinner, the line cross section is larger and, thus, the line resistance is lower.

While the exemplary embodiments illustrated in the figures and described above are presently preferred, it should be understood that these embodiments are offered by way of example only. Other embodiments may include, for example, different methods of implanting species. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

forming a barrier material layer along lateral side walls and a bottom of a via, the via electrically connecting a first conductive layer and a second conductive layer; and tilt implanting at an angle between one and ten degrees, a metal into the barrier material layer at an implantation energy between 5.0 keV and 0.5 keV, the implanted metal making the barrier material layer more resistant to copper diffusion.

2. The method of claim 1, wherein the implanted metal is selected from a group of metals which upon implanting make the barrier material layer amorphous.

3. The method of claim 1, wherein implanting a metal into the barrier material layer includes implanting a low dose of the metal, wherein the low dose comprises $2e^{14}$ to $2e^{15}$ atoms/cm$^2$.

4. The method of claim 1, wherein the implanted metal is selected from a group consisting of Hafnium (Hf), Lanthanum (La), Barium (Ba), Tin (Sn), and Zinc (Zn).

5. The method of claim 1, wherein the implanted metal is selected from a group of heavy metals.

6. The method of claim 1, wherein the barrier material layer has a size of a thickness of between 10 and 300 Angstrom.

7. The method of claim 1, wherein the implanted metal forms an intermettallic with the second conductive layer, the second conductive layer including copper.

8. The method of claim 1, wherein implanting a metal into the barrier material layer includes implanting the metal into the lateral side walls of the via.

9. The method of claim 8, wherein implanting a metal at an angle includes providing an implant that makes lateral side walls of the via amorphous and resistant to copper diffusion.

10. A method of implanting copper barrier material to improve electrical performance in an integrated circuit fabrication process, the method comprising:

providing a copper layer over an integrated circuit substrate;

providing a barrier material at a bottom and sides of a via positioned over the copper layer to form a barrier material layer separating Be via from the copper layer;

amorphizing the barrier material layer by implanting at an angle between one and ten degrees, a metal into the barrier material layer at an implantation energy between 5.0 keV and 0.5 keV, thereby making the barrier material layer more resistant to copper diffusion from the copper layer; and providing a conductive layer over the via such that the via electrically connects the conductive layer to the copper layer.

11. The method of claim 10, wherein the amorphizing step includes implanting a low dose metal species.

12. The method of claim 10, wherein the barrier material layer is Tantalum (Ta), Titanium Nitride (TiN), Titanium Silicon Nitride (TiSiN) or Tungsten Nitride (WNx).

13. The method of claim 10, wherein the amorphizing step includes implanting a metal species into the barrier material layer into the sides of the via.

14. The method of claim 13, wherein the metal species is selected form a group consisting of Hafnium (Hf), Lanthanum (La), Barium (Ba), Tin (Sn), and Zinc (Zn).

15. A method of forming a via in an integrated circuit, the method comprising:

depositing a copper layer;

depositing an etch stop layer over the copper layer;

depositing an insulating layer over the etch stop layer;

forming an aperture in the insulating layer and the etch stop layer;

providing a barrier material at a bottom and sides of the aperture to form a barrier material layer providing separation from the copper layer;

tilt implanting a metal species at an angle between one and ten degrees, into the barrier material layer at an implantation energy between 5.0 keV and 0.5 keV, the implanted metal species making the barrier material layer more resistant to copper diffusion from the copper layer;

filling the aperture with a via material to form the via; and providing a conductive layer over the via such that the via electrically connects the conductive layer to the copper layer.

16. The method of claim 15, wherein implanting a metal species into the barrier material layer includes implanting a low dose of the metal.

17. The method of claim 15, wherein implanting a metal species into the barrier material layer includes implanting the metal into the sides of the aperture.

18. The method of claim 15, wherein the metal species is implanted at a dose of $2e^{14}$ to $2e^{15}$ atoms/cm$^2$ at an energy of 0.5 to 5 keV.

19. The method of claim 15, wherein the barrier material layer and the copper layer form an intermettallic.

20. The method of claim 15, wherein the implanted metal species is selected from a group of heavy metals.

* * * * *

UNITED STATES PATENT AND TRADEMARK OFFICE
CERTIFICATE OF CORRECTION

PATENT NO.    : 6,835,655 B1
DATED         : December 28, 2004
INVENTOR(S)   : Paul R. Besser, Matthew S. Buynoski and Sergey D. Lopatin It is certified that error appears in the above-identified patent and that said Letters Patent is hereby corrected as shown below:

Column 5,
Line 24, delete "Angstrom" and substitute -- Angstroms --.
Line 42, following "separating" delete "Be" and substitute -- the --.

Signed and Sealed this

Nineteenth Day of April, 2005

JON W. DUDAS
*Director of the United States Patent and Trademark Office*